United States Patent
Hunter et al.

(10) Patent No.: US 7,860,379 B2
(45) Date of Patent: Dec. 28, 2010

(54) TEMPERATURE MEASUREMENT AND CONTROL OF WAFER SUPPORT IN THERMAL PROCESSING CHAMBER

(75) Inventors: Aaron Muir Hunter, Santa Cruz, CA (US); Bruce E. Adams, Portland, OR (US); Mehran Behdjat, San Jose, CA (US); Rajesh S. Ramanujam, San Jose, CA (US); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 618 days.

(21) Appl. No.: 11/623,238

(22) Filed: Jan. 15, 2007

(65) Prior Publication Data

US 2008/0170842 A1 Jul. 17, 2008

(51) Int. Cl.
*A21B 2/00* (2006.01)
*A21B 1/00* (2006.01)
*C23C 16/00* (2006.01)

(52) U.S. Cl. .................. 392/416; 118/725; 219/411

(58) Field of Classification Search ............. 392/416, 392/407–425; 118/725, 724; 219/405, 411
See application file for complete search history.

(56) References Cited

U.S. PATENT DOCUMENTS

| 5,755,511 | A | 5/1998 | Peuse et al. | |
|---|---|---|---|---|
| 6,566,630 | B2 * | 5/2003 | Kitamura | 219/390 |
| 6,692,575 | B1 * | 2/2004 | Omstead et al. | 118/728 |
| 6,800,833 | B2 | 10/2004 | Gregor et al. | |
| 6,803,297 | B2 | 10/2004 | Jennings et al. | |
| 6,916,744 | B2 | 7/2005 | Achutharaman et al. | |
| 6,927,169 | B2 | 8/2005 | Maydan et al. | |
| 7,022,192 | B2 * | 4/2006 | Dip et al. | 118/725 |
| 2001/0034004 | A1 * | 10/2001 | Kitamura | 432/250 |
| 2005/0102108 | A1 | 5/2005 | Ramachandran et al. | |
| 2006/0018639 | A1 | 1/2006 | Ramamurthy et al. | |
| 2006/0066193 | A1 | 3/2006 | Ranish et al. | |
| 2006/0086713 | A1 | 4/2006 | Hunter et al. | |
| 2006/0223315 | A1 * | 10/2006 | Yokota et al. | 438/689 |
| 2006/0228818 | A1 | 10/2006 | Chacin et al. | |
| 2006/0240680 | A1 | 10/2006 | Yokota et al. | |
| 2008/0169282 | A1 * | 7/2008 | Sorabji et al. | 219/444.1 |
| 2008/0170842 | A1 * | 7/2008 | Hunter et al. | 392/416 |

FOREIGN PATENT DOCUMENTS

| JP | 2002-110583 | 4/2002 |
|---|---|---|
| KR | 10-2005-0062653 | 6/2005 |
| WO | WO-2006/004783 | 1/2006 |

OTHER PUBLICATIONS

Office Action dated Aug. 28, 2009 for Korean Patent Application No. 10-2008-0003868.
Notification of the Office Rejection dated Mar. 18, 2010 for Chinese Patent Application No. 200810002374.1.
Office Action dated Aug. 21, 2009 for Chinese Patent Application No. 200810002374.1.

* cited by examiner

*Primary Examiner*—Daniel Robinson
(74) *Attorney, Agent, or Firm*—Patterson & Sheridan, L.L.P.

(57) ABSTRACT

The present invention provides apparatus and methods for achieving uniform heating to a substrate during a rapid thermal process. More particularly, the present invention provides apparatus and methods for controlling the temperature of an edge ring supporting a substrate during a rapid thermal process to improve temperature uniformity across the substrate.

4 Claims, 4 Drawing Sheets

TEMPERATURE MEASUREMENT AND CONTROL OF WAFER SUPPORT IN THERMAL PROCESSING CHAMBER

BACKGROUND OF THE INVENTION

1. Field of the Invention

The present invention generally relates to the field of semiconductor processing. More particularly, the present invention relates to methods and apparatus for thermally processing a semiconductor substrate.

2. Description of the Related Art

Rapid thermal processing (RTP) is a process for annealing substrates during semiconductor processing. During RTP, thermal radiation is generally used to rapidly heat a substrate in a controlled environment to a maximum temperature of up to about 1350° C. This maximum temperature is maintained for a specific amount of time ranging from less than one second to several minutes depending on the process. The substrate is then cooled to room temperature for further processing. High intensity tungsten halogen lamps are commonly used as the source of heat radiation. The substrate may be provided additional heat by a heated susceptor conductively coupled to the substrate.

The semiconductor fabrication process has several applications of RTP. Such applications include thermal oxidation, high temperature soak anneal, low temperature soak anneal, and spike anneal. In thermal oxidation, a substrate is heated in oxygen, ozone, or a combination of oxygen and hydrogen which causes silicon substrate to oxidize to form silicon oxide. In high temperature soak anneal, a substrate is exposed to different gas mixtures such as nitrogen, ammonia, or oxygen. Low temperature soak anneal is generally used to anneal substrate deposited with metal. Spike anneal is used when the substrate needs to be exposed to high temperature for a very short time. During a spike anneal, the substrate is rapidly heated to a maximum temperature sufficient to activate dopant and cooled rapidly to end the activation process prior to substantial diffusion of the dopant.

RTP usually requires a substantially uniform temperature profile across the substrate. In the state of the art process, the temperature uniformity may be improved by controlling heat sources, such as a laser, an array of lamps, configured to heat the substrate on the front side while a reflective surface on the back side reflects heat back to the substrate. Emissivity measurement and compensation methodology have been used to improve the temperature gradient across the substrate.

As the semiconductor industry develops, the requirement for temperature uniformity during a RTP also increases. In some processes, it is important to have substantially small temperature gradient from about 2 mm inside the edge of the substrate. Particularly, it may be necessary to heat a substrate at a temperature between about 200° C. to about 1350° C. with a temperature deviation of about 1° C. to 1.5° C. The state of the art RTP systems have difficulties to reach this kind of uniformity, especially near the edge of the substrate. In a RTP system, an edge ring is usually used to support a substrate near the periphery. The edge ring and the substrate overlap producing a complicated heating situation near the edge of the substrate. In one aspect, the substrate may have different thermal properties near the edge. This is mostly pronounced for a patterned substrate, or for a silicon-on isulator-(SOI) substrate. In another aspect, the substrate and the edge ring overlap near the edge, it is difficult to achieve uniform temperature profile near the edge by measuring and adjusting the temperature of the substrate alone. Depending on the edge ring's thermal properties relative to the substrate's thermal and optical properties, the temperature profile of a substrate is generally either edge high or edge low.

FIG. 1 schematically illustrates two types of common temperature profiles of a substrate processed in a RTP chamber. The vertical axis denotes measured temperatures on a substrate. The horizontal axis denotes the distance from the edge of the substrate. Profile 1 is an edge high profile where the edge of the substrate has the highest temperature measurement. Profile 1 is an edge low profile where the edge of the substrate has the lowest temperature measurement. It is difficult to remove temperature deviation near the edge of the substrate in the state of the art RTP systems.

Therefore, there is a need for apparatus and methods used in RTP for improved temperature uniformity.

SUMMARY OF THE INVENTION

The present invention generally provides apparatus and methods for achieving uniform heating to a substrate during a rapid thermal process.

One embodiment of the present invention provides a chamber for processing a substrate comprising a chamber enclosure defining a processing volume, a substrate support disposed in the processing volume, an edge ring disposed on the substrate support, the edge ring is configured to support the substrate on a periphery of the substrate, a first heat source configured to heat the substrate, and a second heat source configured to heat the edge ring, wherein the second heat source is independently controllable from the first heat source.

Another embodiment of the present invention provides a rapid thermal processing chamber comprising a chamber body defining a chamber volume, a temperature controlled edge ring disposed in the chamber volume, wherein the temperature controlled edge ring is configured to thermally coupled with a substrate being processed near a periphery of the substrate, a first heat source configured for primarily heating a surface of the substrate, and a second heat source configured for primarily heating the temperature controlled edge ring.

Yet another embodiment of the present invention provides a method for uniformly heating a substrate to a target temperature comprising positioning the substrate in a processing chamber connected with a first heat source, thermally coupling a periphery of the substrate to an edge ring, heating a surface of the substrate with the first heat source, and maintaining the edge ring at a ring temperature differs from the target temperature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides apparatus and methods for achieving uniform heating to a substrate during a rapid thermal process. More particularly, the present invention provides apparatus and methods for controlling the temperature of an edge ring supporting a substrate during a rapid thermal process to improve temperature uniformity across the substrate.

Figure 1:
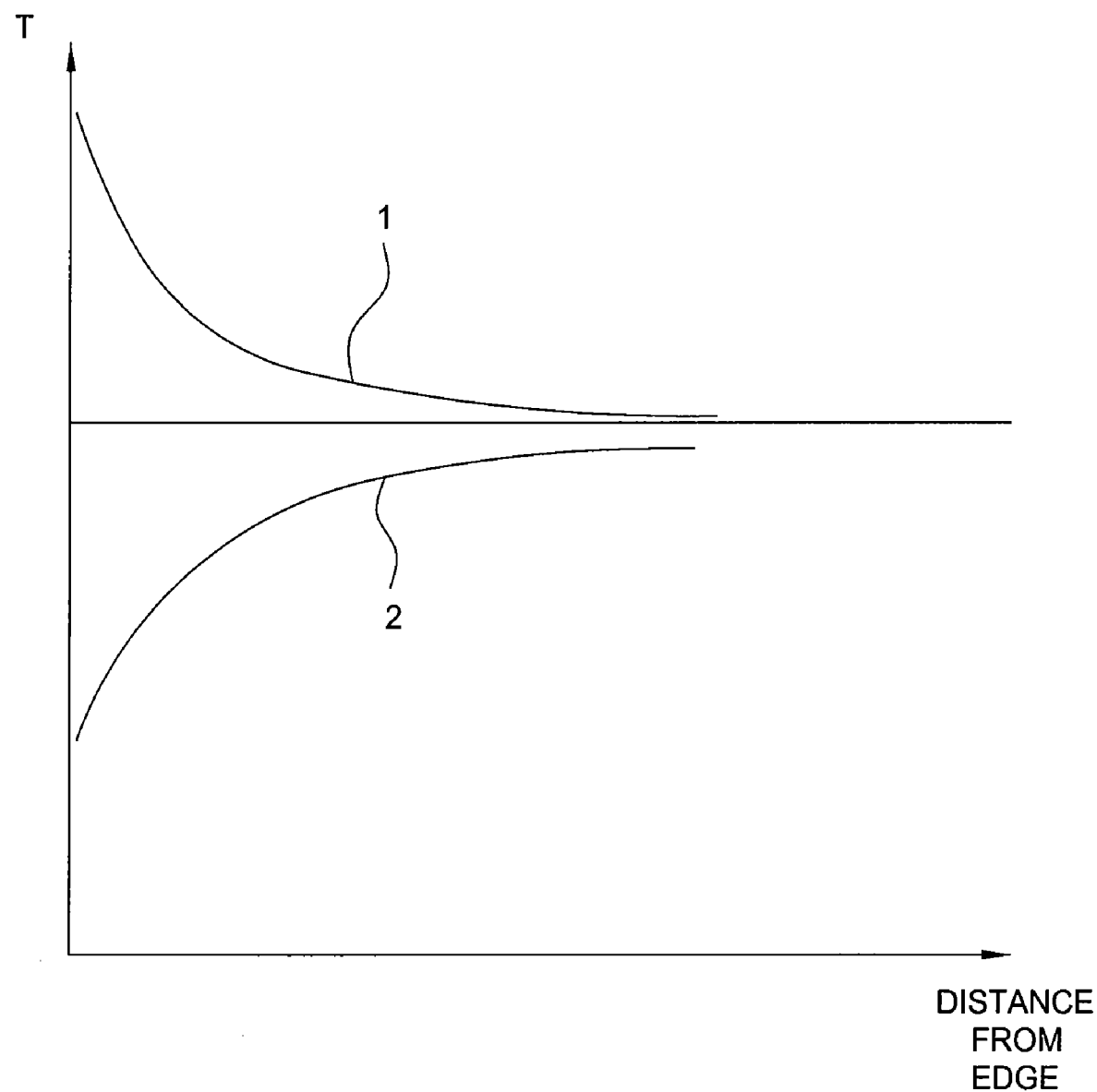
FIG. 1 schematically illustrates two types of common temperature profiles of a substrate processed in a RTP chamber.
Figure 2:
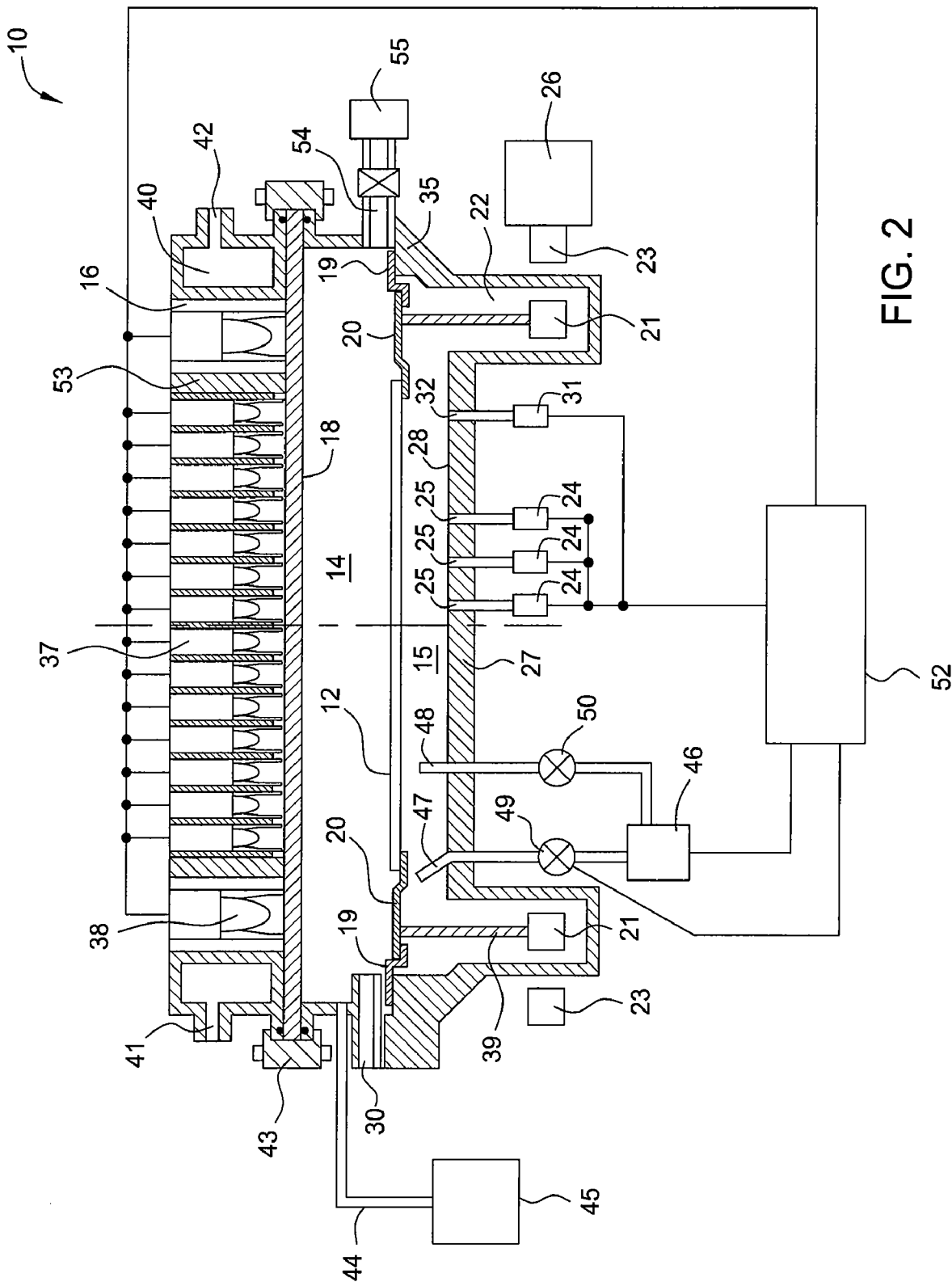
FIG. 2 schematically illustrates a sectional view of a rapid thermal processing system in accordance with one embodiment of the present invention.

FIG. 2 schematically illustrates a sectional view of a rapid thermal processing system 10 in accordance with one embodiment of the present invention. The rapid thermal processing system 10 comprises a chamber body 35 defining a processing volume 14 configured for annealing a disk-shaped substrate 12 therein. The chamber body 35 may be made of stainless steel and may be lined with quartz. The processing volume 14 is configured to be radiantly heated by a heating assembly 16 disposed on a quartz window 18 of the rapid thermal processing system 10. In one embodiment, the quartz window 18 may be water cooled.

A slit valve 30 may be formed on a side of the chamber body 35 providing a passage for the substrate 12 to the processing volume 14. A gas inlet 44 may be connected to a gas source 45 to provide processing gases, purge gases and/or cleaning gases to the processing volume 14. A vacuum pump 55 may be fluidly connected to the processing volume 14 through an outlet 54 for pumping out the processing volume 14.

A circular channel 22 is formed near the bottom of the chamber body 35. A magnetic rotor 21 is disposed in the circular channel 22. A tubular riser 39 rests on or otherwise coupled to the magnetic rotor 21. The substrate 12 is supported by a peripheral edge by an edge ring 20 disposed on the tubular riser 39. A magnetic stator 23 is located externally of the magnetic rotor 21 and is magnetically coupled through the chamber body 35 to induce rotation of the magnetic rotor 21 and hence of the edge ring 20 and the substrate 12 supported thereon. The magnetic stator 23 may be also configured to adjust the elevations of the magnetic rotor 21, thus lifting the substrate 12 being processed. Additional magnetic rotation and levitation information is available in the U.S. Pat. No. 6,800,833, which is hereby incorporated by reference.

The chamber body 35 may include a reflector plate 27 near the back side of the substrate 12. The reflector plate 27 has an optical reflective surface 28 facing the back side of the substrate 12 to enhance the emissivity of the substrate 12. In one embodiment, the reflector plate 27 may be water cooled. The reflective surface 28 and the back side of the substrate 12 define a reflective cavity 15. In one embodiment, the reflector plate 27 has a diameter slightly larger than the diameter of the substrate 12 being processed. For example, if the rapid thermal processing system 10 is configured to process 12 inch substrates, the diameter of the reflector plate 27 may be about 13 inches.

A purge gas may be provided to the reflector plate 27 through a purge gas inlet 48 connected to a purge gas source 46. The purge gas ejected to the reflector plate 27 helps cooling of the reflector plate 27 especially near the apertures 25 where heat is not reflected back to the substrate 12.

In one embodiment, an outer ring 19 may be coupled between the chamber body 35 and the edge ring 20 to separate the reflective cavity 15 from the processing volume 14. The reflective cavity 15 and the processing volume 14 may have different environments.

The heating assembly 16 may comprise an array of heating elements 37. The array of heating elements 37 may be UV lamps, halogen lamps, laser diodes, resistive heaters, microwave powered heaters, light emitting diodes (LEDs), or any other suitable heating elements both singly or in combination. The array of heating elements 37 may be disposed in vertical holes formed in a reflector body 53. In one embodiment, the heating elements 37 may be arranged in a hexagon pattern. A cooling channel 40 may be formed in the reflector body 53. A coolant, such as water, may enter the reflector body 53 from an inlet 41, travel adjacent the vertical holes cooling the array of heating elements 37, and exit the reflector body from an exit 42.

The array of heating elements 37 are connected to a controller 52 which are capable of adjusting heating effects of the array of heating elements 37. In one embodiment, the array of heating elements 37 may be divided into a plurality of heating groups to heat the substrate 12 by multiple concentric zones. Each heating group may be controlled independently to provide desired temperature profile across a radius of the substrate 12. Detailed descriptions of the heating assembly 16 may be found in U.S. Pat. Nos. 6,350,964 and 6,927,169, which are hereby incorporated by reference.

In one embodiment, an edge ring heating assembly 38 configured primarily to heat the edge ring 20 may be disposed outside the array of heating elements 37. The edge ring heating assembly 38 is connected to the controller 52 which may adjust the heating power of the edge ring heating assembly 38. The edge ring heating assembly 38 is independently controllable from the array of heating elements 37, hence controlling the temperature of the edge ring 20 independently from the temperature of the substrate 12. In one embodiment, the edge ring heating assembly 38 may be one of the heating groups of the array of heating elements 37.

The rapid thermal processing system 10 further comprise a plurality of thermal probes 24 configured to measure thermal properties of the substrate 12 at different radial locations. In one embodiment, the plurality of thermal probes 24 may be a plurality of pyrometers optically coupled to and disposed in a plurality of apertures 25 formed in the reflector plate 27 to detect a temperature or other thermal properties of a different radial portion of the substrate 12. Detailed description of similar temperature probes may be found in the U.S. Pat. No. 5,755,511, which is hereby incorporated by reference. The plurality of temperature probes 24 is connected with the controller 52 which may conduct a closed loop control to adjust the power supplies to the array of heating elements 37 to provide a tailored radial thermal profile across the substrate 12.

The rapid thermal processing system 10 further comprises an edge ring thermal probe 31 coupled to and disposed in an aperture 32 on the reflector plate 27 near the edge ring 20. The edge ring thermal probe 31 may be a pyrometer configured to measure a temperature or other thermal properties of the edge ring 20. The edge ring thermal probe 31 is connected with the controller 52 which is connected to the edge ring heating assembly 38. The controller 52 may conduct a closed loop control to the edge ring heating assembly 38 using the measurement from the edge ring thermal probe 31. In one embodiment, the edge ring 20 may be heated to a desired temperature independently from the substrate 12 during a thermal process.

A gas jet 47 may be disposed near the edge ring 20 for cooling the edge ring 20. In one embodiment, the gas jet 47 may share the same purge gas source 46 with the purge gas inlet 48. The gas jet 47 may be directed to the edge ring 20 and ejecting a cooling gas, such as helium, to cool the edge ring 20. The gas jet 47 may be connected to the gas source 46 through a valve 49 which may be controlled by the controller 52. The controller 52, therefore, may include the cooling effect of the gas jet 47 in the closed looped temperature control of the edge ring 20.

The edge ring 20 may be designed to have thermal properties, such as thermal mass, emissivity and absorptivity, according to the thermal properties of the substrate 12 being processed to improve substrate temperature profile. The thermal properties of the edge ring 20 may be altered by choosing different materials, different thicknesses and different coatings. A detailed description of edge ring design may be found in the U.S. Pat. No. 7,127,367, which is hereby incorporated by reference. In one embodiment, the edge ring 20 may be made from silicon with a nickel coating.

During a rapid thermal process, the substrate 12 may be transferred to the processing volume 14 through the slit valve 30 and supported by the edge ring 20. The magnetic rotor 21 may rotate the substrate 12 and position the substrate 12 in a desired elevation. During most processes, the objective is to rapidly heat the substrate 12 uniformly to a target temperature. In one embodiment of the present invention, heat transfer to the substrate 12 mainly comes from radiation of the array of heating elements 37 and conduction and/or radiation from the edge ring 20 which is heated in a desired temperature. A uniform temperature profile across the substrate 12 may be achieved by controlling the array of heating elements 37 and by keeping the edge ring 20 at the desired temperature which is usually different than the target temperature for the substrate 12.

Controlling the array of heating element 37 may be conducted by measuring the temperature of the substrate 12 across a radius using the plurality of thermal probes 24. In one embodiment, the plurality of thermal probes 24 may be evenly distributed across the reflector plate 27 corresponding to a radius of the substrate 12. The measured temperatures from the plurality of thermal probes 24 are sampled by the controller 52. The controller 52 may used the measured temperatures to adjust the array of heating elements 37 so that the temperature across a radius of the substrate 12 becoming uniform. In one embodiment, the controller 52 may adjust the array of heating elements 37 by a plurality of concentric zones. Detailed descriptions of controlling heating elements by multiple zones may be found in U.S. Pat. No. 5,755,511 and U.S. patent application Ser. No. 11/195,395, published as U.S. Patent Application Publication No. 2006/0066193, which are hereby incorporated by reference.

In one embodiment, heat exchange between the edge ring 20 and a periphery of the substrate 12 is used to adjust the temperature profile near the edge of the substrate 12. Heat exchange may be achieved by conduction and/or radiation between the substrate 12 and the edge ring 20. In one embodiment, heat exchange may be conducted by heating the edge ring 20 to a temperature different from the target temperature of the substrate 12.

In one embodiment, a desired temperature may be predetermined for the edge ring 20 according to process requirements and thermal properties of both the edge ring 20 and the substrate 12. In one embodiment, the predetermined desired temperature of the edge ring 20 may be about 10° C. to about 15° C. different from the target temperature of the substrate 12. In one embodiment, the predetermined desired temperature of the edge ring 20 may be higher than the target temperature of the substrate 12. In another embodiment, the predetermined desired temperature of the edge ring 20 may be lower than the target temperature of the substrate 12. The desired edge ring temperature may be determined from either heat transfer modeling (conductive, radiative, convective) or from experimental results. In either case, the optical properties of the substrate and/or the edge ring are varied and the temperature uniformity of the wafer is measured. The results of these experiments lead to prediction of the desired temperature profile for the edge ring to achieve the best uniformity on the substrate.

In another embodiment, the desired temperature for the edge ring 20 may be dynamic and adjustable according to the in-situ thermal measurements of the substrate 12 and the edge ring 20.

Heating the edge ring 20 may be achieved primarily by using the edge ring heating assembly 38. A closed loop control may be achieved by the controller 52 by adjusting the temperature of the edge ring 20 from the measurement of the edge ring thermal probe 31. Adjustment of the temperature of the edge ring 20 may be achieved by adjusting the power supply of the edge ring heating assembly 38 and/or flow rate of the cooling gas from the gas jet 47. In one embodiment, the edge ring 20 may be over heated and then cooled down to a desired temperature with cooling gas from the gas jet 47.

In one embodiment of the present invention, the cooling gas for the gas jet 47 may be used to cool the edge ring 20 to between about 100° C. and about 200° C. after processing one substrate and prior to the entry of the next substrate.

The method of the present invention can provide less than 2° C., 3 sigma temperature uniformity for spike annealing. The method of the present invention provide less than 1° C., 3 sigma temperature uniformity for high temperature soak annealing up to 1350° C. In one embodiment, the method of the present invention can heat a substrate at a temperature between about 200° C. to about 1350° C. with a temperature deviation of about 1° C. to about 1.5° C.

The edge ring heating element 38 of the rapid thermal processing system 10 is illustrated as a plurality of heating lamps. Other suitable heating device, such as for example solid state heaters (i.e., LEDs), laser heaters, inductive heaters, and microwave heaters, electrical heaters (e.g., resistive heating) can be used in the rapid thermal processing systems of the present invention.

Figure 3:
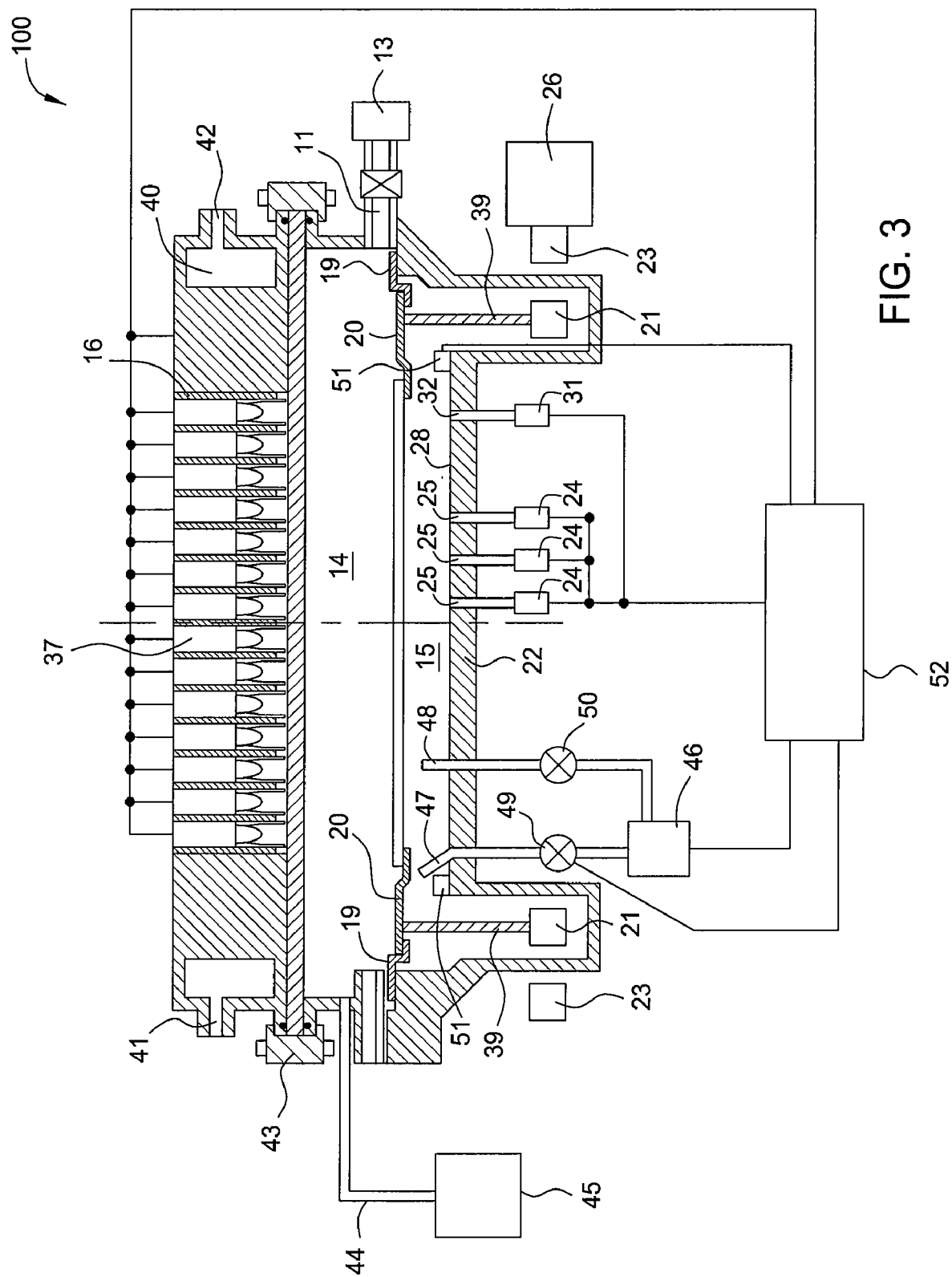
FIG. 3 schematically illustrates a sectional view of a rapid thermal processing system in accordance with another embodiment of the present invention.

Additionally, the edge ring heating element may be positioned in other suitable locations, such as underneath the edge ring, on a side of the edge ring. FIG. 3 schematically illustrates a sectional view of a rapid thermal processing system 100 having an edge ring heating element 51 positioned below the edge ring 20.

In another embodiment, a substrate may be heated from a backside during thermal processing. An exemplary backside heating chamber may comprise an edge ring for supporting the substrate by a periphery with a frontside (the production side) facing up. An array of heating elements, similar to the heating elements 37, may be positioned underneath the edge ring so that the substrate can be heated from the backside. A plurality of probes may be positioned across the radius of the substrate above the edge ring to measure a temperature profile of the substrate during thermal processing. An edge ring heater dedicated to independently heat the edge ring may be positioned near the edge ring, underneath the edge ring, above the edge ring, or on a side of the edge ring. An edge ring probe may be positioned adjacent the edge ring configured to measure the temperature of the edge ring. A controller may be connected to the edge ring heater, the edge ring probe, the array of heating elements and the plurality of probes to control the temperature profile of the substrate and the temperature of the edge ring in-situ.

Figure 4:
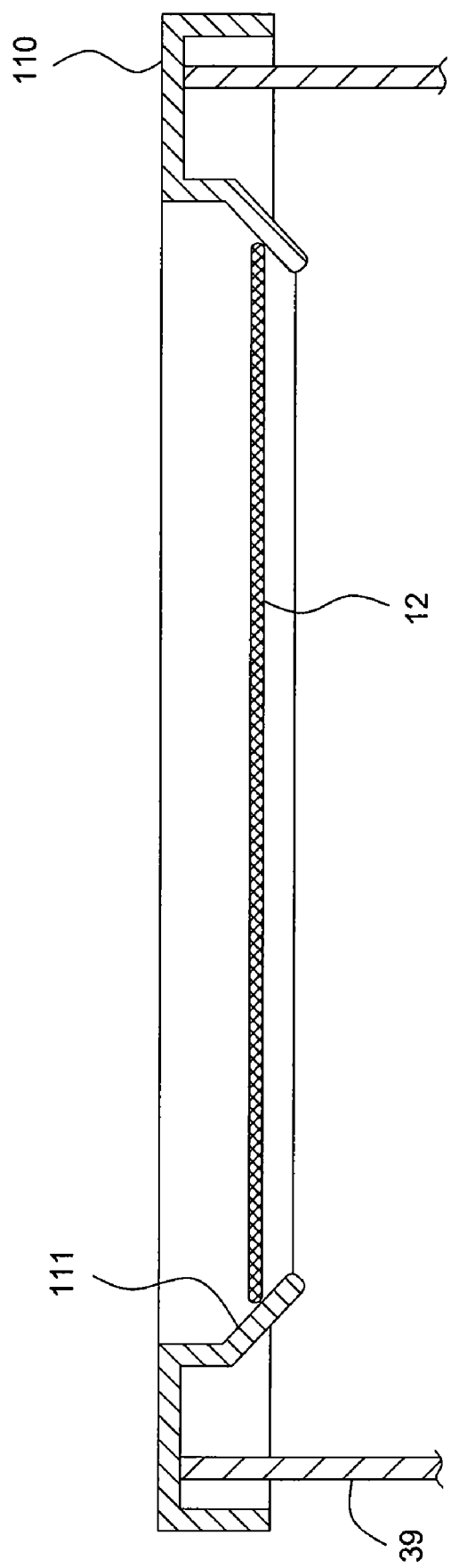
FIG. 4 schematically illustrates a sectional view of an edge ring in accordance with one embodiment of the present invention.

FIG. 4 schematically illustrates a sectional view of an edge ring 110 in accordance with one embodiment of the present invention. The edge ring 110 has a slant lip 111 configured to support the substrate 12. The edge ring 110 is designed to reduce the contact area with the substrate 12. By reducing the contact area between the substrate 12 and the edge ring 110, the heating condition near the edge of the substrate 12 may be simplified and edge high/low effect may be reduced. Additionally, reducing contact area also reduces particle contamination in the processing chamber.

Although the above discussion is focused on achieving uniform temperature profile across a substrate, a non-uniform temperature profile could also be achieved using the apparatus and methods of the present invention.

While the foregoing is directed to embodiments of the present invention, other and further embodiments of the invention may be devised without departing from the basic scope thereof, and the scope thereof is determined by the claims that follow.

The invention claimed is:

1. A chamber for processing a substrate of, comprising:
a chamber enclosure defining a processing volume;
a tubular riser disposed in the processing volume;
an edge ring disposed on the tubular riser, the edge ring configured to support the substrate on a periphery of the substrate;
a first heat source configured to heat the substrate; and
a second heat source configured to heat the edge ring, wherein the second heat source is independently controllable from the first heat source, and the second heat source is positioned underneath the edge ring, wherein the edge ring has a slant tip configured to support the substrate with reduced contact area.

2. A chamber for processing a substrate, comprising:
a chamber enclosure defining a processing volume;
a tubular riser disposed in the processing volume;
an edge ring disposed on the tubular riser, the edge ring configured to support the substrate on a periphery of the substrate;
a first heat source configured to heat the substrate, wherein the first heat source comprises a plurality of heating elements configured to direct radiant heat energy towards a first side of the substrate;
a second heat source configured to heat the edge ring, wherein the second heat source is one of a radiant heater, a conductive heat source, a resistive heater, an inductive heater, and a microwave heater, and the second heat source is independently controllable from the first heat source, and the second heat source is positioned underneath the edge ring; and
a reflector plate having an optical reflective surface, wherein the reflector plate is positioned to face a second side of the substrate.

3. The chamber of claim 2, further comprising a purge gas inlet configured to provide a purge gas to the reflector plate to cool the reflector plate.

4. A chamber for processing a substrate, comprising:
a chamber enclosure defining a processing volume;
a tubular riser disposed in the processing volume;
an edge ring disposed on the tubular riser, the edge ring configured to support the substrate on a periphery of the substrate;
a first heat source configured to heat the substrate, wherein the first heat source comprises a plurality of heating elements configured to direct radiant heat energy towards a first side of the substrate;
a second heat source configured to heat the edge ring, wherein the second heat source is one of a radiant heater, a conductive heat source, a resistive heater, an inductive heater, and a microwave heater, and the second heat source is independently controllable from the first heat source, and the second heat source is positioned underneath the edge ring;
an edge ring thermal probe configured to measure thermal properties of the edge ring;
a gas jet configured to direct cooling gas to the edge ring; and
a controller configured to conduct a closed loop control using the edge ring thermal probe measurement by adjusting the power supply of the second heat source and/or the flow rate of the cooling gas from the gas jet.

* * * * *

UNITED STATES PATENT AND TRADEMARK OFFICE
CERTIFICATE OF CORRECTION

PATENT NO. : 7,860,379 B2  
APPLICATION NO. : 11/623238  
DATED : December 28, 2010  
INVENTOR(S) : Hunter et al.

Page 1 of 1

It is certified that error appears in the above-identified patent and that said Letters Patent is hereby corrected as shown below:

Title Page;
In the References Cited (56):
Please delete "2006/0086713 A1 4/2006 Hunter et al." and insert --2006/0086716 A1 4/2006 Korecki-- therefor;

In the Claims:
Column 7, Claim 1, Line 25, please delete "of" after substrate.

Signed and Sealed this
Twenty-second Day of March, 2011

David J. Kappos
*Director of the United States Patent and Trademark Office*